(12) United States Patent
Peng

(10) Patent No.: US 11,520,230 B2
(45) Date of Patent: Dec. 6, 2022

(54) PI SUBSTRATE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Ningkun Peng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 374 days.

(21) Appl. No.: 16/641,632

(22) PCT Filed: Nov. 20, 2019

(86) PCT No.: PCT/CN2019/119677
§ 371 (c)(1),
(2) Date: Feb. 24, 2020

(87) PCT Pub. No.: WO2021/056777
PCT Pub. Date: Apr. 1, 2021

(65) Prior Publication Data
US 2021/0405525 A1 Dec. 30, 2021

(30) Foreign Application Priority Data
Sep. 29, 2019 (CN) .......................... 201910930456.0

(51) Int. Cl.
*G03F 7/00* (2006.01)
*H01L 51/00* (2006.01)

(52) U.S. Cl.
CPC ........ *G03F 7/0007* (2013.01); *H01L 51/0096* (2013.01)

(58) Field of Classification Search
CPC ............... G03F 7/0007; H01L 51/0097; H01L 51/0096
See application file for complete search history.

(56) References Cited

U.S. PATENT DOCUMENTS

| | | | | |
|---|---|---|---|---|
| 11,262,795 | B2* | 3/2022 | Kuwabara | ............ G06F 3/04886 |
| 11,296,284 | B2* | 4/2022 | Seo | .......... H01L 51/56 |
| 11,302,878 | B2* | 4/2022 | Li | .......... H01L 51/003 |
| 2017/0179429 | A1 | 6/2017 | Jin et al. | |
| 2020/0176720 | A1* | 6/2020 | Bu | ....... H01L 27/3262 |

FOREIGN PATENT DOCUMENTS

| | | | | |
|---|---|---|---|---|
| CN | 105280841 | A | 1/2016 | |
| CN | 106158740 | A | 11/2016 | |
| CN | 107369761 | A * | 11/2017 | ........... H01L 27/323 |
| CN | 10906500 | * | 12/2018 | |
| CN | 109065500 | A | 12/2018 | |
| CN | 108288680 | B * | 9/2020 | ......... H01L 27/3244 |
| CN | 107785393 | B * | 3/2022 | ........... G03F 7/0007 |

\* cited by examiner

*Primary Examiner* — Vinh T Lam
(74) *Attorney, Agent, or Firm* — PV IP PC; Wei Te Chung; Ude Lu

(57) ABSTRACT

The disclosure provides a polyimide (PI) substrate and a manufacturing method thereof. The PI substrate includes a first area and a plurality of second areas, wherein the second areas are spaced apart from each other in the first area, and the PI substrate includes a glass substrate and a plurality of PI layers disposed on the glass substrate.

8 Claims, 1 Drawing Sheet

PI SUBSTRATE AND MANUFACTURING METHOD THEREOF

CROSS-REFERENCE TO RELATED APPLICATIONS

This application claims priority to China Patent Application No. 201910930456.0 filed on Sep. 29, 2019 in the National Intellectual Property Administration and entitled "PI SUBSTRATE AND MANUFACTURING METHOD THEREOF", the disclosure of which is incorporated herein by reference.

FIELD

The present disclosure relates to the field of flat display technologies, and more particularly, relates to a polyimide (PI) substrate and a manufacturing method thereof.

BACKGROUND

With continuous development of display technologies, novel flat display devices have gradually replaced cathode ray tube (CRT) display devices to become mainstream in market.

Among flat display devices, liquid crystal displays (LCDs) were rapidly accepted by the market from the very beginning due to properties such as light weight and thin body, and have been widely used in diverse applications, which allowed them to gain a high market proportion.

However, LCD devices still have some defects in terms of display performances. As a result, the industry is continuously developing new flat display technologies, including organic light-emitting diode (OLED).

OLED display devices have many advantages such as self-luminescence, low driving voltage, high luminous efficiency, fast response time, high sharpness, high contrast, nearly 180-degree viewing angle, wide operating temperature range, and capability of realizing flexible, large-area, and full-color displays. Among OLED display devices, active-matrix organic light-emitting diode (AMOLED) display panels are gradually becoming a next-generation mainstream display technology due to characteristics such as high contrast, wide color gamut, low power consumption, and bendability.

Specifically, AMOLED display panels typically have a large-scale design. In specific applications, to obtain a panel with a standard shape, a "double-cut process" must be performed on the display panel. However, the double-cut process usually cannot achieve high cutting accuracy. Moreover, cracks generated at a cutting periphery due to cutting forces during the double-cut process may extend into the panel along a direction of the cutting force. Therefore, a border area having an anticrack design must be defined, wherein the border area is where the double-cutting process is performed. Moreover, to-be-processed cutting tracks at a periphery of the panel and the anticrack design make it impossible to effectively reduce a size of a predetermined border area.

SUMMARY

One aspect of the present disclosure is to provide a PI substrate having a novel design of structure, thereby reducing a border area, which must be defined, to a certain degree.

Technical solutions provided by the present disclosure are described as follows.

A polyimide (PI) substrate, including a first area and a plurality of second areas. The second areas are spaced apart from each other in the first area, and the PI substrate includes a glass substrate and a plurality of PI layers disposed on the glass substrate. The PI layers are only correspondingly disposed with respect to the second areas so that the PI layers on the glass substrate are spaced apart from each other.

In the present disclosure, an arrangement that the PI layers are spaced from each other can be understood as a patterning process that patterns an entire PI layers. Therefore, an arrangement of the PI layers on the glass substrate has been changed from an integrated form to the arrangement that the PI layers are spaced from each other according to shape and size requirements. Originally, a panel needs to be double-cut to achieve a predetermined size, but now, because the PI layers are patterned, the panel, which is to be double-cut, is separated. As a result, the panel having a predetermined size can be realized just by peeling off the panel from a glass substrate. Therefore, not only can a double-cut process be omitted, but also problems caused by the double-cut process mentioned in the above background can be prevented.

Furthermore, in other embodiments, the second areas are arranged in an array in the first area, and the PI layers are correspondingly arranged in an array on the glass substrate.

Furthermore, in other embodiments, distances between the PI layers on two adjacent second areas range from 100 µm to 500 µm.

Furthermore, in other embodiments, vertical distances between the PI layers on the two adjacent second areas range from 100 µm to 500 µm.

Furthermore, in other embodiments, horizontal distances between the PI layers on the two adjacent second areas range from 100 µm to 500 µm.

Furthermore, in other embodiments, the PI substrate further includes a plurality of third areas disposed in the first area and spaced apart from the second areas, and the plurality of PI layers are correspondingly disposed on the glass substrate in the third areas.

Furthermore, in other embodiments, the PI layers on the second areas are configured to manufacture a display panel, and the PI layers on the third areas are configured to manufacture a component functional layer for performing a display panel assembly test. In other embodiments, the PI layers on the third areas may also be configured to manufacture other external functional layers associated with a display panel and are not limited by the present disclosure. Furthermore, the glass substrate may also be provided with a fourth area and a fifth area according to practical requirements, and various device functional layers disposed on the PI layers may also be disposed on such areas. Because the PI layers under the device functional layers are separated from the PI layers disposed in a display panel area of the glass substrate, the double-cut process, which is a later process after an integrated PI layer is formed and is mentioned in the background, can be omitted.

Furthermore, another aspect of the present disclosure provides a method of manufacturing the PI substrate, including following steps:

Step 1: providing the glass substrate having the first area and the plurality of second areas, wherein the second areas are spaced apart from each other in the first area, and then forming an entire PI layer on the glass substrate; and Step 2: patterning the PI layer by using a photomask so that the PI layer only remains on the second areas after being exposed, developed, and etched.

Furthermore, in other embodiments, in the Step 2, the photomask includes a main body, a plurality of shading areas are disposed on the main body and are spaced from each other, a plurality of light transmittance areas are disposed between the shading areas, and the shading areas correspond to the second areas on the glass substrate.

Furthermore, in other embodiments, distances between the shading areas range from 100 μm to 500 μm.

Regarding the beneficial effects: the present disclosure relates to a PI substrate and a manufacturing method thereof, and a novel PI layer process is applied thereto. Compared with conventional technology, the present disclosure further performs patterning processes, such as exposure, development, and etching, on a PI layer. An original arrangement in which an integrated PI layer is disposed under a display panel has been changed to an arrangement in which PI layers under each of the display panels are separated from PI layers disposed on a glass substrate at a periphery of a large plate. Therefore, when a laser lift off (LLO) process is performed on the display panels, the display panels can be directly peeled off from the glass substrate where the display panels are disposed, so that a double-cut process can be omitted. Hence, under a predetermined border specification, because the cutting tunnels and the anticrack design corresponding thereto can be omitted, a layout space for circuits is more sufficient, a size of a border area is significantly reduced, and a narrow-frame display panel is realized.

Furthermore, this added process of patterning the integrated PI layers can bring more benefits in addition to benefits to a design of the border area. As the PI layers are disposed in a spaced-apart manner on the glass substrate, this allows the subsequently formed display panels on these spaced-apart PI layers to be able to directly peel off from the glass substrate. As a result, the double-cut process can be omitted, and a problem of low cutting accuracy no longer exists. In addition, after the LLO process, a problem of cracks due to cutting can also be prevented.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Technical solutions regarding a PI substrate and a manufacturing method thereof provided by the present disclosure are further described below in conjunction with accompanying drawings and embodiments.

Figure 1:
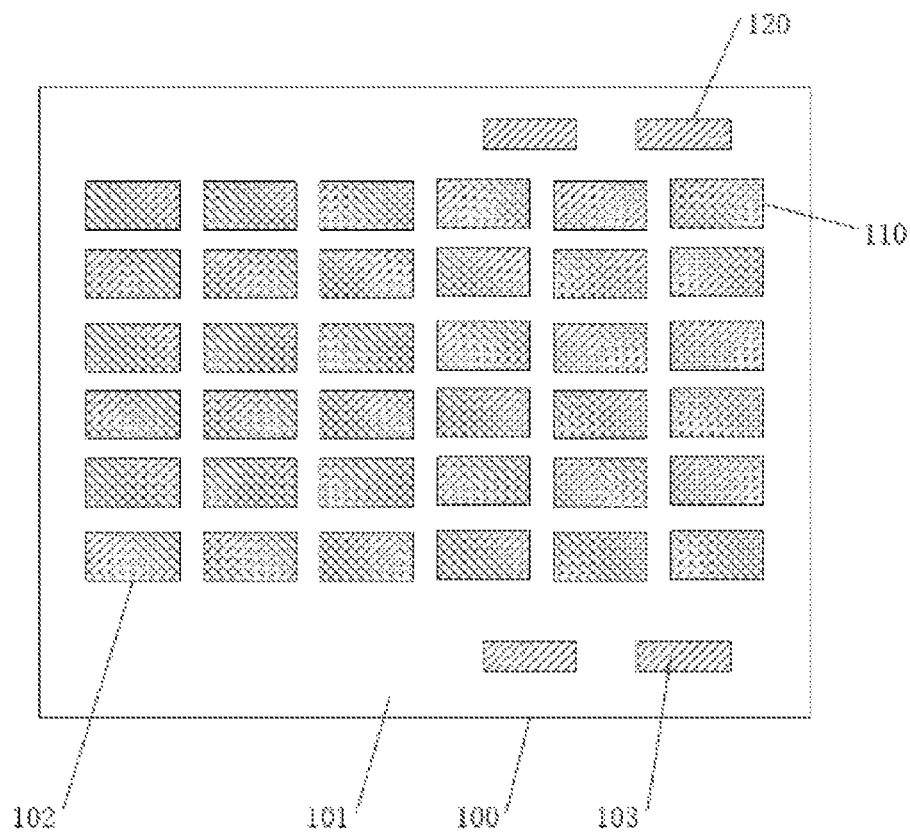
FIG. 1 is a schematic structural view showing a PI substrate provided by an embodiment of the present disclosure.

As shown in FIG. 1, an embodiment of the present disclosure provides a PI substrate including a first area 101 and a plurality of second areas 102, wherein the second areas 102 are spaced apart from each other in the first area 101.

The PI substrate includes a glass substrate 100 and a plurality of PI layers disposed thereon, and the PI layers are only correspondingly disposed with respect to the second areas 102. For ease of description, the PI layers in the second areas 102 are defined as first PI layers 110. Functional layers of a subsequent display panel are correspondingly disposed on the first PI layers 110 so as to form a plurality of display panels (not shown) arranged in an array on the glass substrate 100. Because the first PI layers 110 under the display panels are not integrated as in conventional technology, but are spaced apart from each other, a double-cut process, which splits a display panel to achieve a predetermined size, can be substituted by a peeling-off process. Therefore, not only can the double-cut process be omitted, but problems caused by the double-cut process mentioned in the above background can also be prevented.

Furthermore, in other embodiments, sizes of the second areas 102 in the first area 101 can be adjusted according to requirements, but are not limited to be same.

Furthermore, in the first area 101 outside the array formed from the second areas 102, a plurality of third areas 103 can be further disposed thereon according to requirements, and PI layers are also disposed on the third areas 103. For ease of description, The PI layers disposed on the third areas 103 are defined as second PI layers 120, which are configured to manufacture a component functional layer for performing a display panel assembly test (or test element group, TEG) on the second areas 102 on the glass substrate.

Furthermore, in the first area 101 outside the array formed from the second areas 102, a plurality of fourth areas and a plurality of fifth areas can be disposed thereon according to requirements, and PI layers are also disposed on such areas disposed outside the array formed from the second areas 102, thereby forming functional layers for testing the display panels on the second areas 102. Therefore, the functional layers are not limited to only one TEG functional layer.

Figure 2:
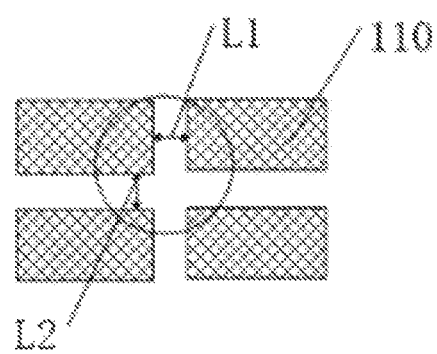
FIG. 2 is an enlarged view of FIG. 1.

Furthermore, as shown in FIG. 2, distances between the first PI layers 110 on two adjacent second areas 102 range from 100 μm to 500 μm, and the distances include vertical distances L1 and horizontal distances L2. The vertical distances L1 and the horizontal distances L2 may be about 200 μm, but are not limited thereto.

Furthermore, another aspect of the present disclosure provides a method of manufacturing the PI substrate, including following steps:

Step 1: providing a glass substrate 100 having a first area 101, a plurality of second areas 102, and a plurality of third areas 103, wherein the second areas 102 are arranged in an array in the first area 101, and the third areas 103 are disposed in the first area 101 outside the array formed from the second areas 102, and forming an entire PI layer on the glass substrate 100; and Step 2: patterning the PI layer by using a photomask so that the PI layer only remains on the second areas 102 after being exposed, developed, and etched.

Specifically, in the Step 2, the photomask includes a main body. A plurality of shading areas are disposed on the main body and are spaced from each other, a plurality of light transmittance areas are disposed between the shading areas, and the shading areas correspond to the second areas 102 and the third areas 103 on the glass substrate. As a result, when making subsequent exposures, an exposure light can only be emitted onto the first area 101 of the glass substrate 100.

The present disclosure relates to a PI substrate and a manufacturing method thereof, and a novel PI layer process is applied thereto. By performing patterning processes, such as exposure, development, and etching, on a PI layer, an original arrangement in which an integrated PI layer is disposed under a display panel has been changed to an arrangement in which PI layers under each of the display panels are separated from PI layers disposed on a glass substrate at a periphery of a large plate. Therefore, when a laser lift off (LLO) process is performed on the display panels, the display panels can be directly peeled off from the glass substrate where the display panels are disposed, so that a double-cut process can be omitted. Hence, under a predetermined border specification, because the cutting tunnels and the anticrack design corresponding thereto can be omitted, a layout space for circuits is more sufficient, a size of a border area is significantly reduced, and a narrow-frame display panel is realized.

Furthermore, this added process of patterning the integrated PI layers can bring more benefits in addition to benefits to a design of the border area. As the PI layers are disposed in a spaced-apart manner on the glass substrate, this allows the subsequently formed display panels on these spaced-apart PI layers to be able to directly peel off from the glass substrate. As a result, the double-cut process can be omitted, and a problem of low cutting accuracy no longer exists. In addition, after the LLO process, a problem of cracks due to cutting can also be prevented.

The preferred embodiments are not intended to limit the present disclosure, and it is understood that many changes and modifications to the described embodiment can be carried out without departing from the scope and the spirit of the disclosure that is intended to be limited only by the appended claims.

What is claimed is:

1. A polyimide (PI) substrate, comprising a first area and a plurality of second areas, and a plurality of third areas;
    wherein the second areas are spaced apart from each other in the first area, the third areas are spaced apart from each other and are spaced apart from the second areas in the first area, and the PI substrate comprises a glass substrate and a plurality of PI layers disposed on the glass substrate;
    wherein the PI layers comprise a plurality of first PI layers and a plurality of second PI layers, the first PI layers are correspondingly disposed on the second areas, the second PI layers are correspondingly disposed on the third areas, so that the PI layers on the glass substrate are spaced apart from each other; and
    wherein the first PI layers are configured to manufacture a display panel, the second PI layers are configured to manufacture a functional layer for performing a display panel assembly test, and a size of the first PI layers and a size of the second PI layer are different.

2. The PI substrate of claim 1, wherein the second areas are arranged in an array in the first area, and the PI layers are correspondingly arranged in an array on the glass substrate.

3. The PI substrate of claim 1, wherein distances between the first PI layers on two adjacent second areas range from 100 µm to 500 µm.

4. The PI substrate of claim 3, wherein vertical distances between the first PI layers on the two adjacent second areas range from 100 µm to 500 µm.

5. The PI substrate of claim 3, wherein horizontal distances between the first PI layers on the two adjacent second areas range from 100 µm to 500 µm.

6. A method of manufacturing the PI substrate of claim 1, comprising following steps:
    Step 1: providing the glass substrate having the first area and the plurality of second areas, and the plurality of third areas, wherein the second areas are spaced apart from each other in the first area, and then forming the entire PI layers on the glass substrate; and
    Step 2: patterning the PI layers by using a photomask so that the PI layers only remain on the second areas and the third areas after being exposed, developed, and etched.

7. The method of claim 6, wherein in the Step 2, the photomask comprises a main body, a plurality of shading areas are disposed on the main body and are spaced from each other, a plurality of light transmittance areas are disposed between the shading areas, and the shading areas correspond to the second areas on the glass substrate.

8. The method of claim 7, wherein distances between the shading areas range from 100 µm to 500 µm.

* * * * *